(12) United States Patent
Mosley et al.

(10) Patent No.: US 7,724,498 B2
(45) Date of Patent: May 25, 2010

(54) LOW INDUCTANCE CAPACITORS, METHODS OF ASSEMBLING SAME, AND SYSTEMS CONTAINING SAME

(75) Inventors: Larry E. Mosley, Santa Clara, CA (US); Clive R. Hendricks, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 838 days.

(21) Appl. No.: 11/428,331

(22) Filed: Jun. 30, 2006

(65) Prior Publication Data
US 2008/0001253 A1    Jan. 3, 2008

(51) Int. Cl.
*H01G 4/228*  (2006.01)
(52) U.S. Cl. .......................... 361/306.3; 257/E27.048; 361/328
(58) Field of Classification Search ............... 361/306.3, 361/328, 306.1; 257/E27.048
See application file for complete search history.

(56) References Cited

U.S. PATENT DOCUMENTS

| | | | |
|---|---|---|---|
| 5,666,004 A | 9/1997 | Bhattacharyya et al. | |
| 5,923,523 A * | 7/1999 | Herbert | ................... 361/306.1 |
| 6,262,877 B1 | 7/2001 | Mosley | |
| 6,631,540 B2 | 10/2003 | Mosley | |
| 6,657,848 B2 * | 12/2003 | Togashi et al. | ........... 361/306.3 |
| 6,770,969 B2 | 8/2004 | Mosley | |
| 6,801,422 B2 | 10/2004 | Mosley | |
| 6,905,925 B2 | 6/2005 | Mosley | |
| 7,019,346 B2 | 3/2006 | Mosley | |
| 7,099,139 B2 | 8/2006 | Mosley et al. | |
| 7,149,071 B2 | 12/2006 | Mosley | |
| 7,173,804 B2 | 2/2007 | Radhakrishnan et al. | |
| 7,216,406 B2 | 5/2007 | Palanduz et al. | |
| 7,218,504 B2 | 5/2007 | Steyskal et al. | |
| 2005/0195555 A1 | 9/2005 | Steyskal et al. | |
| 2006/0001068 A1 | 1/2006 | Mosley et al. | |
| 2006/0067030 A1 | 3/2006 | Mosley et al. | |
| 2006/0067033 A1 | 3/2006 | Mosley | |
| 2006/0070219 A1 | 4/2006 | Palanduz et al. | |
| 2007/0002520 A1 | 1/2007 | Mehr et al. | |
| 2007/0242417 A1 | 10/2007 | Mosley et al. | |

FOREIGN PATENT DOCUMENTS

| | | | |
|---|---|---|---|
| JP | 2000277378 A | 10/2000 | |
| JP | 2004336041 A | 11/2004 | |

(Continued)

OTHER PUBLICATIONS

Mosley, Larry, et al., "Controlled-Resistance Capacitors, and Methods of Assembling Same", U.S. Appl. No. 11/173,877, filed Jun. 30, 2005.

(Continued)

*Primary Examiner*—Jerome Jackson, Jr.
*Assistant Examiner*—Paul A Budd
(74) *Attorney, Agent, or Firm*—John N. Greaves

(57) ABSTRACT

A low-inductance capacitor exhibits a first characteristic inductance during use in a first capacitor subsection and a second characteristic inductance during use in a second capacitor subsection, and the first and second characteristic inductances act to neutralize each other. A process of forming the low-inductance capacitor includes heat curing. A package includes a low-inductance capacitor and a mounting substrate.

9 Claims, 12 Drawing Sheets

FOREIGN PATENT DOCUMENTS

JP        2005005467 A        1/2005

OTHER PUBLICATIONS

Mosley, Larry, "Electrolytic Polymer Capacitors for Decoupling Power Delivery, Packages Made Therewith, and Systems Containing Same", U.S. Appl. No. 10/957,068, filed Sep. 30, 2004.

Mosley, Larry, et al., "Forming Carbon Nanotube Capacitors", U.S. Appl. No. 11/244,540, filed Oct. 6, 2005.

International Search Report and Written Opinion for PCT Application No. PCT/US2007/072109, mailed Dec. 7, 2007, 9 Pages.

International Preliminary Report on PCT Patent Application No. PCT/US2007/072109, mailed Jan. 15, 2009, 5 Pages.

* cited by examiner

LOW INDUCTANCE CAPACITORS, METHODS OF ASSEMBLING SAME, AND SYSTEMS CONTAINING SAME

TECHNICAL FIELD

Embodiments relate to capacitors that are used for processor decoupling, among other uses.

TECHNICAL BACKGROUND

Electrical circuits often include capacitors for various purposes such as filtering, bypassing, power decoupling, and performing other functions. High-speed digital integrated circuits such as processors and computer chipsets in particular exhibit improved performance when the power supplied to the integrated circuit is filtered with a capacitor placed physically close to the integrated circuit.

Such power decoupling capacitors function to smooth out irregularities in the voltage supplied to the integrated circuits, and so serve to provide the integrated circuits with a more ideal voltage supply.

By placing the decoupling capacitors near the integrated circuit, parasitic impedances such as printed circuit board path resistance or inductance are minimized, which allows easy and efficient transfer of energy from the decoupling capacitor to the integrated circuit. Minimization of series resistance and inductance in the capacitor itself is also desirable for the same purposes, and it results in a more efficient and desirable decoupling or bypass capacitor.

The internal series resistance of the capacitor is typically known as the Equivalent Series Resistance, or ESR. Similarly, internal series inductance is known as Equivalent Series Inductance, or ESL. Both of these parameters can be measured for a given capacitor, and they are among the basic criteria used to select capacitors for applications such as integrated circuit power supply decoupling.

Efforts to minimize ESL and ESR have included solutions such as using multiple types of capacitors in various configurations.

BRIEF DESCRIPTION OF THE DRAWINGS

In order to depict the manner in which the embodiments are obtained, a more particular description of embodiments briefly described above will be rendered by reference to specific embodiments that are illustrated in the appended drawings. Understanding that these drawings depict only typical embodiments that are not necessarily drawn to scale and are not therefore to be considered to be limiting of its scope, the embodiments will be described and explained with additional specificity and detail through the use of the accompanying drawings in which.

DETAILED DESCRIPTION

Embodiments in this disclosure relate to a low-inductance capacitor component that is used in an integrated circuit (IC) package. Embodiments also relate to processes of forming low-inductance capacitors.

The following description includes terms, such as upper, lower, first, second, etc., that are used for descriptive purposes only and are not to be construed as limiting. The embodiments of a device or article described herein can be manufactured, used, or shipped in a number of positions and orientations. The terms "die" and "chip" generally refer to the physical object that is the basic workpiece that is transformed by various process operations into the desired integrated circuit device. A die is usually singulated from a wafer, and wafers may be made of semiconducting, non-semiconducting, or combinations of semiconducting and non-semiconducting materials. A board is typically a resin-impregnated fiberglass structure that acts as a mounting substrate for the die.

FIG. 1 reveals views of a capacitor according to an embodiment.

Figure 1A:
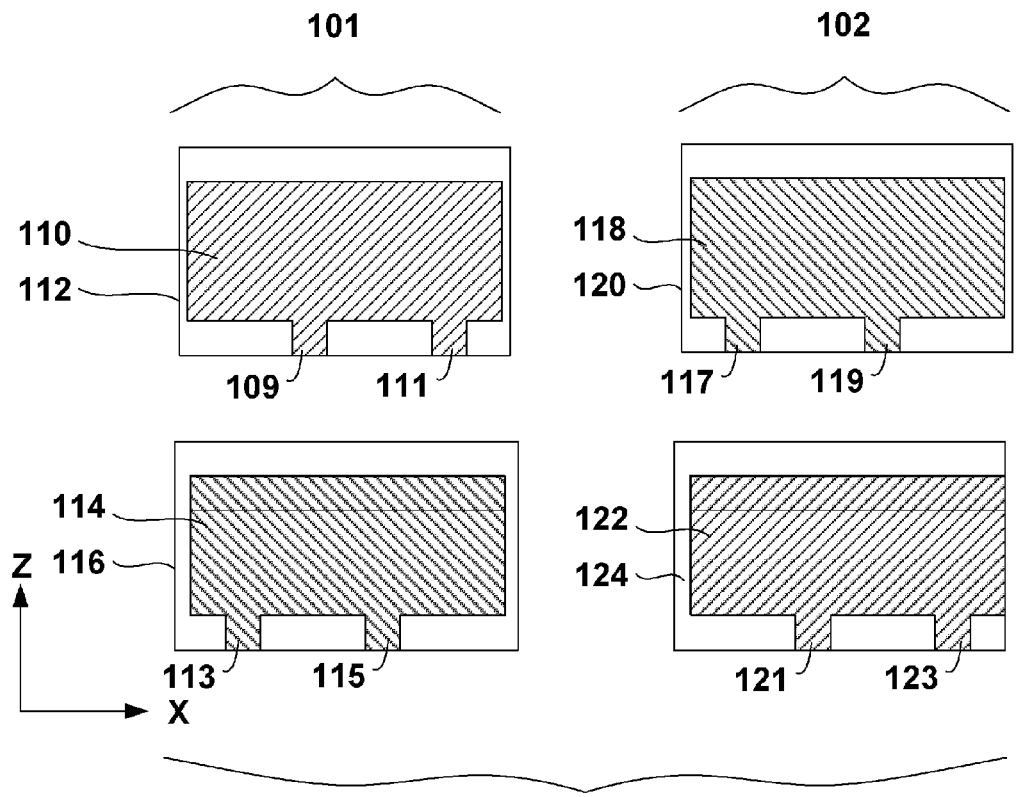
FIGS. 1A and 1B reveal views of a capacitor according to an embodiment.

In FIG. 1A, a capacitor first structure 101 exhibits a first characteristic inductance during charging and discharging. In an embodiment, the first characteristic inductance can be characterized as being "right-hand" in quality, and having a given quantity, L. Hereinafter, a "first characteristic inductance" is understood to be one of overall right-hand or left-hand. Consequently, a "second characteristic inductance" must be necessarily the other of overall right-hand or left-hand. Therefore with respect to "opposite" this means if the first characteristic inductance is right-hand, the second characteristic inductance is left-hand and vice versa.

The capacitor first structure 101 includes a first electrode 110 and a first dielectric 112, and a second electrode 114 and a second dielectric 116. The first electrode 110 and the second electrode 114 are displayed as separated for illustrative purposes. The first electrode 110 includes a power first tab 109 and a power second tab 111. The second electrode 114 includes a ground first tab 113 and a ground second tab 115.

Figure 1B:
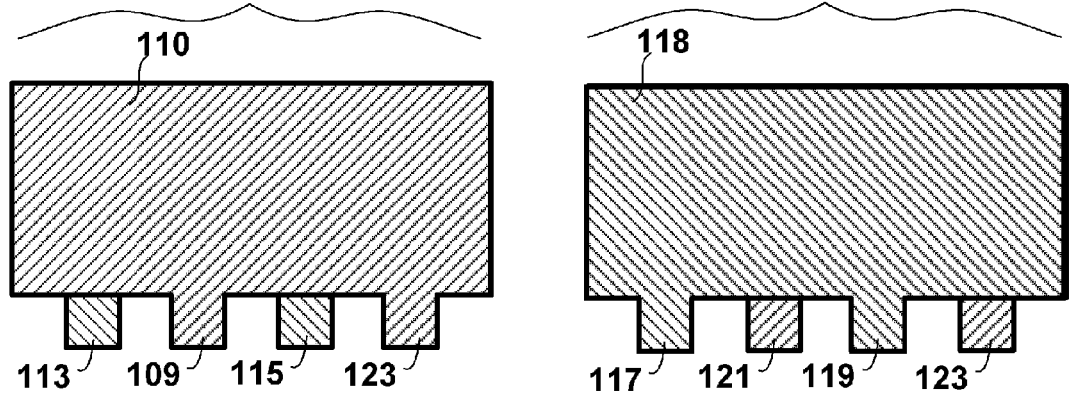

The first electrode 110 and the second electrode 114 are assembled as illustrated in FIG. 1B, and are depicted without the respective dielectrics, such that the first electrode 110 is illustrated with the power first tab 109 and the power second tab 111 on top, and the second electrode 114 (FIG. 1A) is illustrated with only the ground first tab 113 and the ground second tab 115 showing from beneath.

In FIG. 1A, a capacitor second structure 102 exhibits a second characteristic inductance during charging and discharging. In an embodiment, the second characteristic inductance can be characterized as being "left-hand" in quality, and having a given quantity, L. Accordingly, the first characteristic inductance during charging and discharging is substantially opposite the second characteristic inductance during charging and discharging. The effect thereof acts to substantially cancel the individual inductances because of the final structure of the capacitor.

The capacitor second structure 102 includes a first electrode 118 and a first dielectric 120, and a second electrode 122 and a second dielectric 124. The first electrode 118 includes a power first tab 117 and a power second tab 119. The second electrode 122 includes a ground first tab 121 and a ground second tab 123. The first electrode 118 and the second electrode 122 are assembled as illustrated in FIG. 1B, and are depicted without the respective dielectrics, such that the first electrode 118 is illustrated with the power first tab 117 and the power second tab 119 on top, and the second electrode 122 (FIG. 1A) is illustrated with only the ground first tab 121 and the ground second tab 123 showing from beneath.

In an embodiment, the capacitor first structure 101 and the capacitor second structure 102 are each repeated such that a plurality of alternating power and ground electrodes for each capacitor structure is provided. According to an embodiment, the number of power and ground electrodes for a capacitor embodiment is in a range from about 4 (one repeat each) to about 10,000 (2,499 repeats each) or more, depending upon the thickness of the electrodes and the totality of space in the Y-dimension, which reveals the thicknesses of the electrodes and the dielectrics. In an embodiment, the number of power and ground electrodes is in a range from about 100 to about 2,000. In an embodiment, the number of power and ground electrodes is in a range from about 400 to about 800. In an embodiment, spacing between a given power capacitor electrode and a given ground capacitor electrode is in a range from about 0.1 mil to about 0.5 mils. In an embodiment, the spacing is about 0.3 mils.

In an embodiment, the dielectric material that is placed between capacitor electrodes is silica. In an embodiment, a barium titanate dielectric material is placed between the capacitor electrodes. In an embodiment, a barium strontium titanate dielectric material is placed between the capacitor electrodes. In one embodiment, the dielectric material is a low-K (meaning having a dielectric constant lower than that of silica) such as SiLK® made by Dow Chemical of Midland, Mich., or FLARE® made by AlliedSignal Inc. of Morristown, N.J. Other dielectric materials can be used according to a given application.

Figure 2:
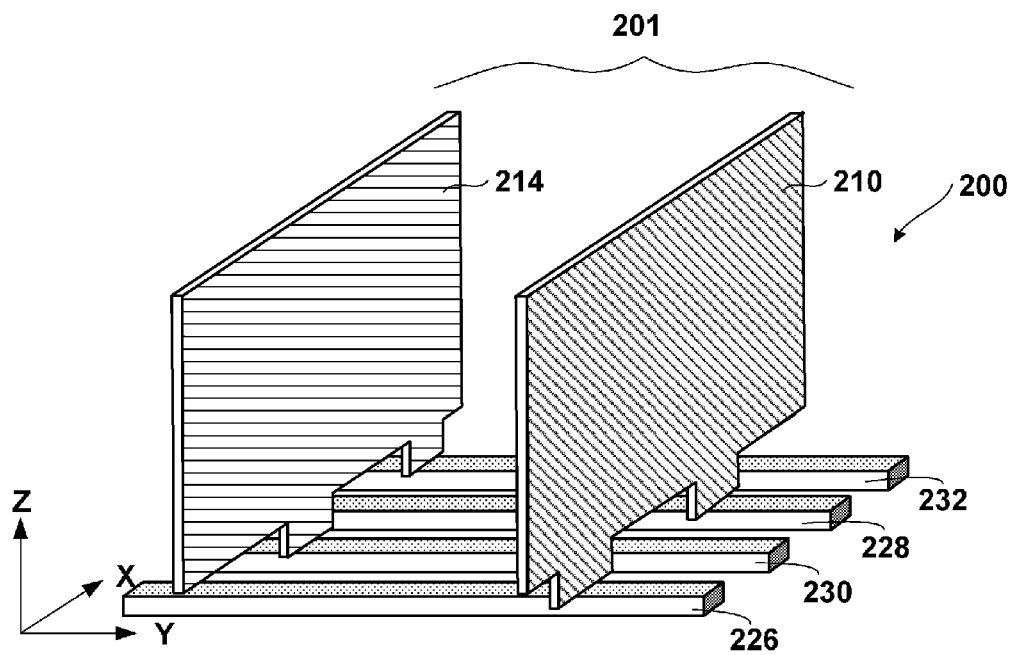
FIG. 2 is a perspective view of portions of a capacitor according to an embodiment.

FIG. 2 is a perspective view of portions of a capacitor 200 according to an embodiment. A capacitor first structure 201 includes a first electrode 210 and a second electrode 214. The first electrode 210 and second electrode 214 are depicted as having connection to a plurality of power and ground terminals. Dielectric materials are not illustrated for clarity of the electrodes. The first electrode 210 is coupled to a power first terminal 226 and a power second terminal 228. The second electrode 214 is coupled to a ground first terminal 230 and a ground second terminal 232.

In FIG. 2, the first electrode 210 exhibits a first characteristic inductance during charging and discharging. In an embodiment, the first characteristic inductance can be characterized as being "right-hand" in quality, and having a given quantity, L. In FIG. 2, the second electrode 214 exhibits a second characteristic inductance during charging and discharging. In an embodiment, the second characteristic inductance can be characterized as being "left-hand" in quality, and having a given quantity, L. Accordingly, the first characteristic inductance during charging and discharging is substantially opposite the second characteristic inductance during charging and discharging. The effect acts to substantially cancel the individual inductances because of the final structure of the capacitor article.

Figure 3:
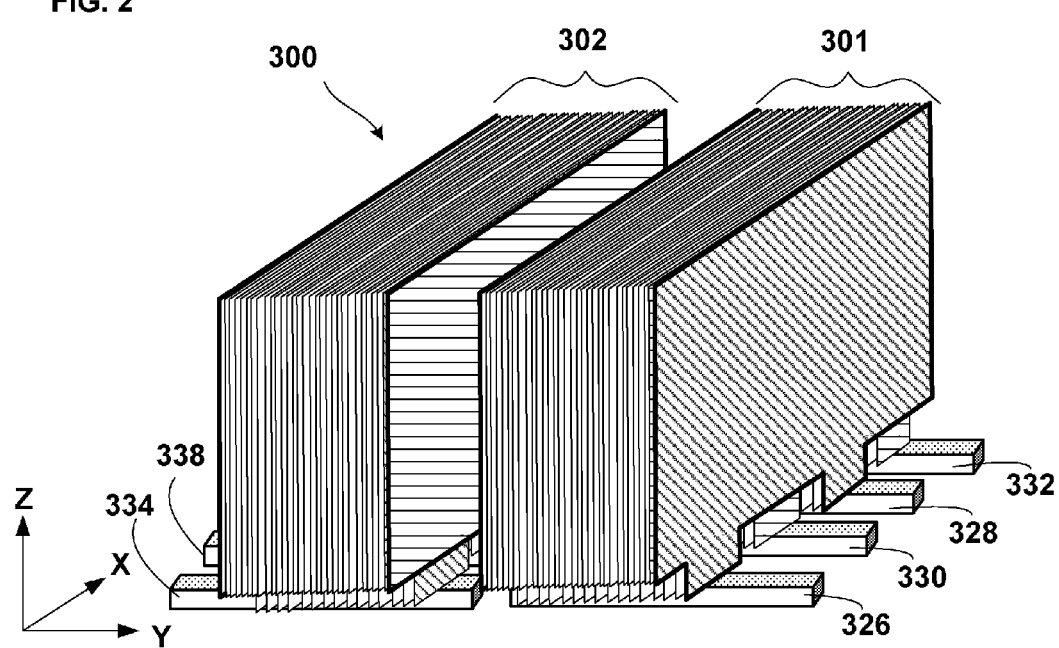
FIG. 3 is a perspective view of portions of a capacitor according to an embodiment.

FIG. 3 is a perspective view of portions of a capacitor 300 according to an embodiment. The capacitor 300 reveals more structure than the capacitor 200 depicted in FIG. 2. In FIG. 3, a capacitor first structure 301 is a composite of alternating power and ground electrodes, and a capacitor second structure 302 is a composite of alternating ground and power electrodes. These alternating ground and power electrodes represent repeats. As a composite, the capacitor first structure 301 exhibits a third characteristic inductance during charging and discharging, and the capacitor second structure 302 exhibits a fourth characteristic inductance during charging and discharging. The effect thereof acts to substantially cancel the individual inductances because of the final structure of the capacitor 300.

The capacitor first structure 301 and capacitor second structure 302 are each depicted as having connection to a plurality of power and ground terminals. Dielectric materials are not illustrated for clarity of the electrodes. The capacitor first structure 301 and capacitor second structure 302 are each appropriately coupled to a power first terminal 326, a power second terminal 328, a ground first terminal 330, and a ground second terminal 332. Additionally, four other power and ground terminals are coupled to the capacitor first structure 301 and capacitor second structure 302, two of which are viewable, as a power fifth terminal 338 and a ground sixth terminal 334.

As illustrated in FIG. 3, all terminals are located in substantially a single plane, also referred to as a coplanar configuration, such that a surface mount of the capacitor 300 is possible. Accordingly, inductive looping in the capacitor 300 is unique to the capacitor embodiment.

Figure 4:
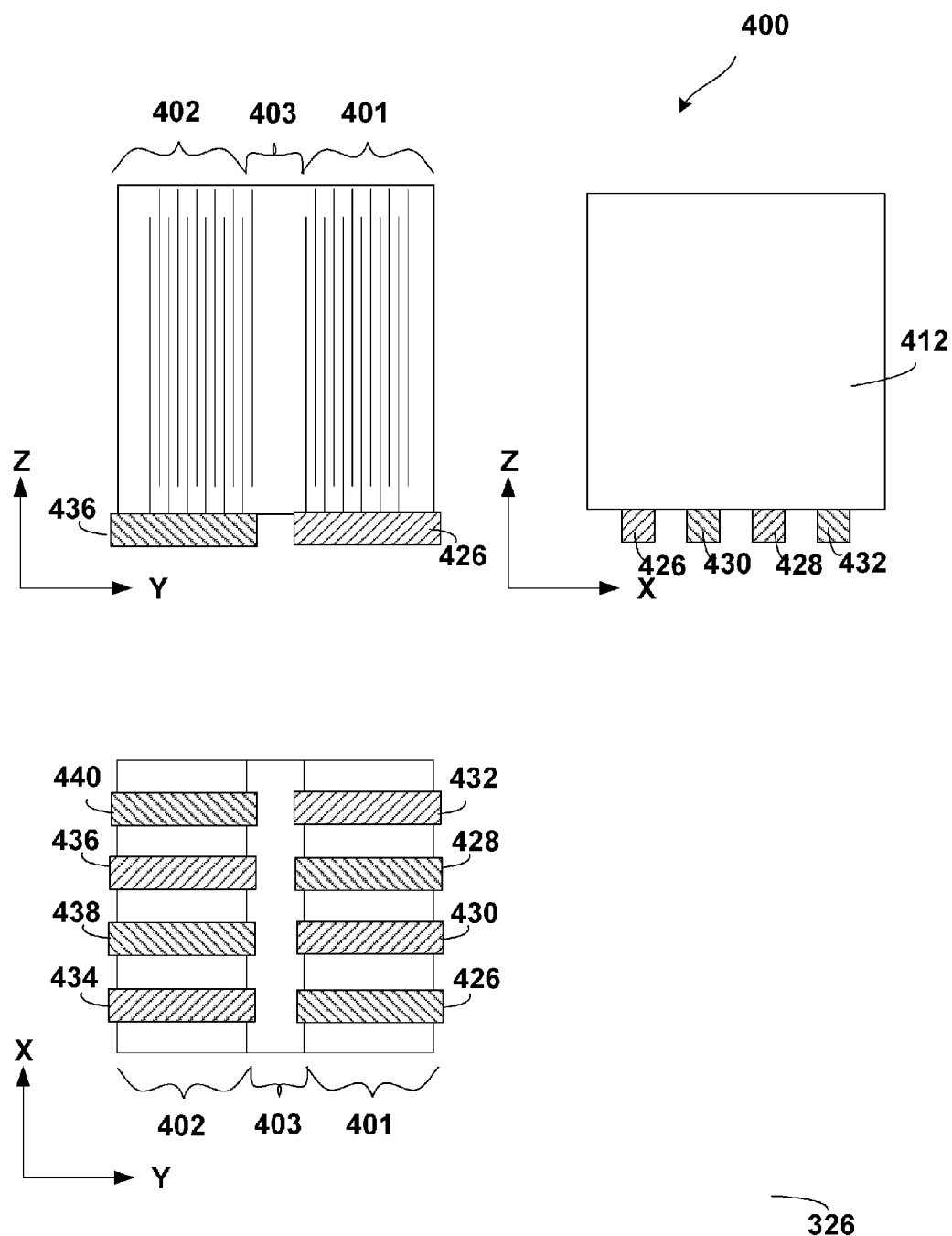
FIG. 4 reveals elevations of a capacitor package according to an embodiment.

FIG. 4 reveals elevations of a capacitor package 400 according to an embodiment. In a Y-Z elevation, a capacitor first structure 401 and capacitor second structure 402 are spaced apart and separated by a spacer 403. The capacitor first structure 401 can be mapped analogously to the capacitor first structure 301 depicted in FIG. 3. Similarly, the capacitor second structure 402 can be mapped analogously to the capacitor second structure 302 depicted in FIG. 3. In an embodiment, the spacer 403 is a dielectric material such as the dielectric material that interdigitates with the electrodes of the capacitor structures. In an embodiment, the spacer 403 is manufactured simultaneously with the manufacture of the capacitor first structure 401 and capacitor second structure 402, such that, for example, the capacitor first structure 401 is first assembled, followed by the spacer 403, and subsequently by the capacitor second structure 402.

In an X-Y elevation, which is the bottom view of the Y-Z elevation, the capacitor first structure 401 and capacitor second structure 402 are revealed as spaced apart by the spacer 403. The capacitor 400 communicates to the outside world by a plurality of terminals. Power terminals in the capacitor first structure 401 include a power first terminal 426 and a power second terminal 428. Ground terminals in the capacitor first structure 401 include a ground first terminal 430 and a ground second terminal 432. Power terminals in the capacitor second structure 402 include a power first terminal 438 and a power second terminal 440. Ground terminals in the capacitor second structure 402 include a ground first terminal 434 and a ground second terminal 436.

In an X-Z elevation, the capacitor 400 exhibits a first dielectric 412 that can be mapped analogously to the first dielectric 112 depicted in FIG. 1. Various terminals of the capacitor first structure 401 are visible in this elevation; the power first terminal 426, the power second terminal 428, the ground first terminal 430, and the ground second terminal 432.

Figure 5:
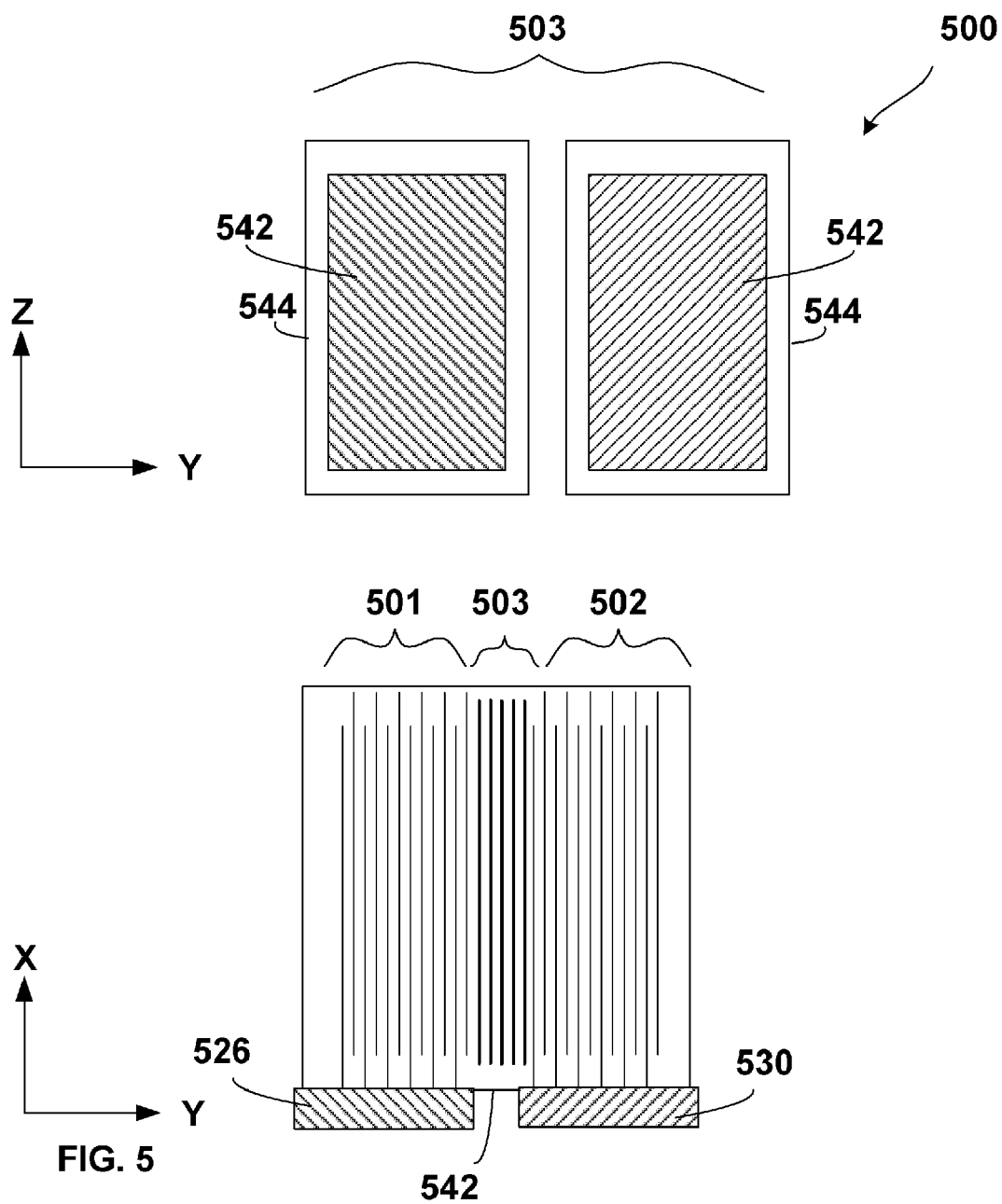
FIG. 5 reveals views of a capacitor according to an embodiment.

FIG. 5 reveals views of a capacitor 500 according to an embodiment. In an embodiment, the capacitor 500 includes a capacitor first structure 501, a capacitor second structure 502 and a spacer 503. In this embodiment, the spacer 503 is a plurality of interdigitated capacitor floating electrodes 542, two of which are illustrated, and dielectric layers 544, two of which are also illustrated.

In a Y-Z elevation, the capacitor 500 is assembled including the capacitor first structure 501, the spacer 503, and the capacitor second structure 502. The capacitor first structure 501 is coupled to a power first terminal 526 and the capacitor second structure 502 is coupled to a ground first terminal 530. The capacitor floating electrodes 542 are structurally similar to the electrodes in the capacitor first structure 501 and capacitor second structure 502, such that during heat processing, the capacitor 500 obtains a substantially uniform structural integrity.

FIG. 6 reveals views of a portion of a capacitor according to an embodiment. The final-assembled capacitor structure of this embodiment includes power and ground terminals as illustrated in FIGS. 3-5 and 7C.

Figure 6A:
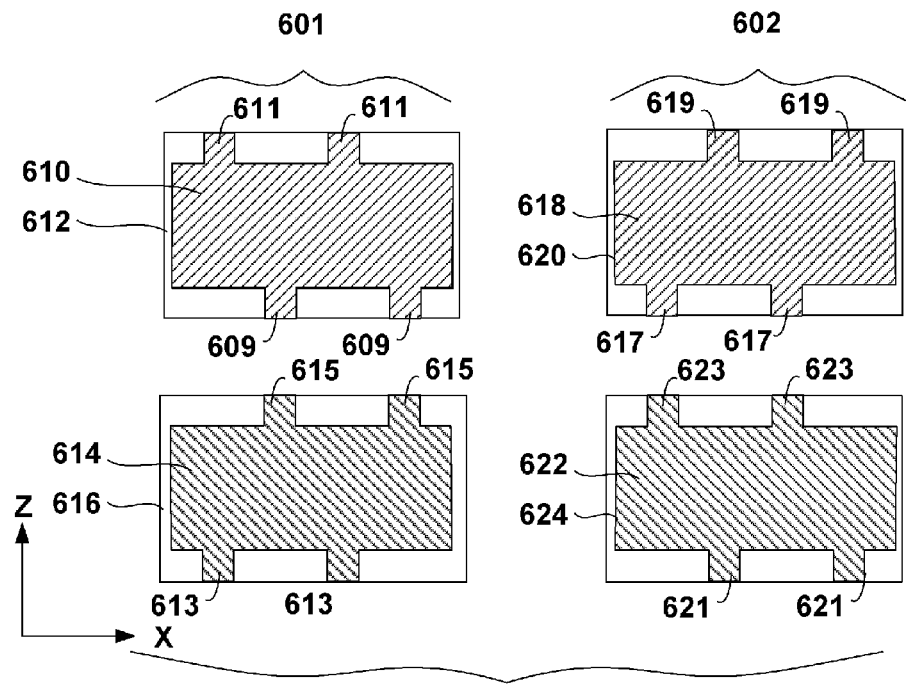
FIGS. 6A and 6B reveal views of a capacitor according to an embodiment.

In FIG. 6A, a capacitor first structure 601 exhibits a first characteristic inductance during charging and discharging. In an embodiment, the first characteristic inductance can be characterized as being "right-hand" in quality, and having a given quantity, L.

Figure 6B:
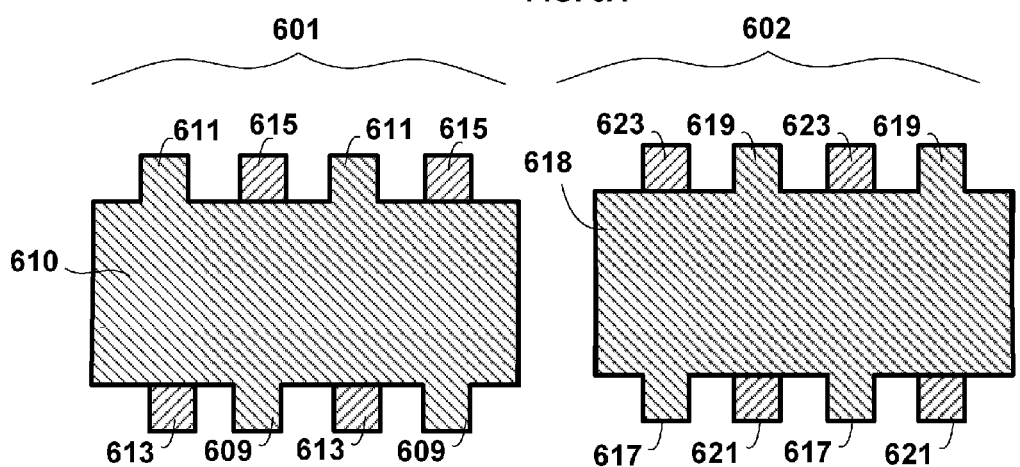

The capacitor first structure 601 includes a first electrode 610 and a first dielectric 612, and a second electrode 614 and a second dielectric 616. The first electrode 610 includes a power first tab 609, two occurrences, and a power second tab 611, also two occurrences. The second electrode 614 includes a ground first tab 613, two occurrences, and a ground second tab 615, also two occurrences. The first electrode 610 and the second electrode 614 are assembled as illustrated in FIG. 6B, and are depicted without the respective dielectrics, such that the first electrode 610 is illustrated with the power first tabs 609 and the power second tabs 611 on top, and the second electrode 614 (FIG. 6A) is illustrated with only the ground first tabs 613 and the ground second tabs 615 showing from beneath.

In FIG. 6A, a capacitor second structure 602 exhibits a second characteristic inductance during charging and discharging. In an embodiment, the second characteristic inductance can be characterized as being "left-hand" in quality, and having a given quantity, L. Accordingly, the first characteristic inductance during charging and discharging is substantially opposite the second characteristic inductance during charging and discharging. The effect acts to substantially cancel the individual inductances because of the final structure of the capacitor article.

The capacitor second structure 602 includes a first electrode 618 and a first dielectric 620, and a second electrode 622 and a second dielectric 624. The first electrode 618 includes a power first tab 617, two occurrences, and a power second tab 619, also two occurrences. The second electrode 622 includes a ground first tab 621, two occurrences, and a ground second tab 623, also two occurrences. The first electrode 618 and the second electrode 622 are assembled as illustrated in FIG. 6B, and are depicted without the respective dielectrics, such that the first electrode 618 is illustrated with the power first tabs 617 and the power second tabs 619 on top, and the second electrode 622 (FIG. 6A) is illustrated with only the ground first tabs 621 and the ground second tabs 623 showing from beneath.

In an embodiment, the capacitor first structure 601 and the capacitor second structure 602 are repeated such that a plurality of alternating power and ground plates for each capacitor structure is provided, according to any of the embodiments set forth in this disclosure. In an embodiment, spacing between a given power capacitor electrode and a given ground capacitor electrode is in a range from about 0.1 mil to about 0.5 mils. In an embodiment, the spacing is about 0.3 mils.

FIG. 7 reveals views of a capacitor according to an embodiment.

Figure 7A:
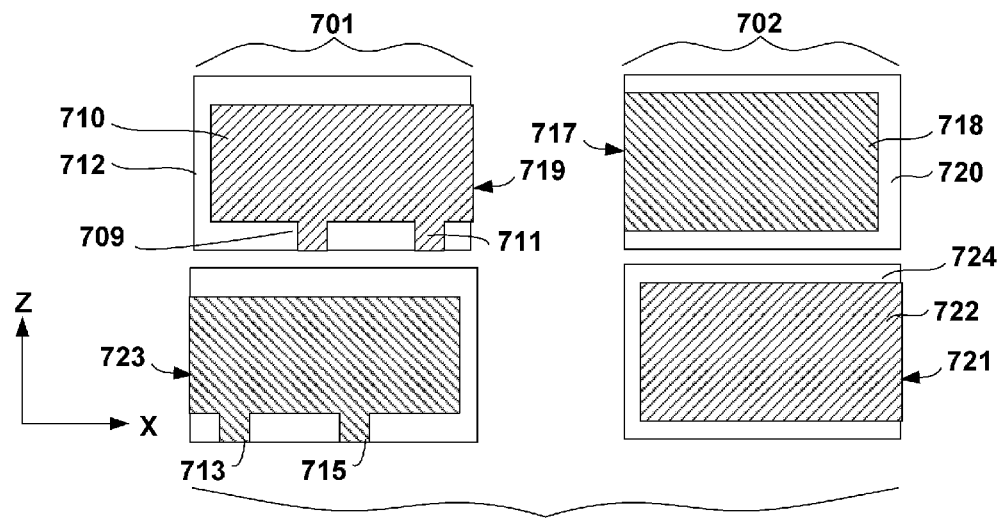
FIGS. 7A, 7B, and 7C reveal views of a capacitor according to an embodiment.

In FIG. 7A, a capacitor first structure 701 exhibits a first characteristic inductance during charging and discharging. In an embodiment, the first characteristic inductance can be characterized as being "right-hand" in quality, and having a given quantity, L.

Figure 7B:
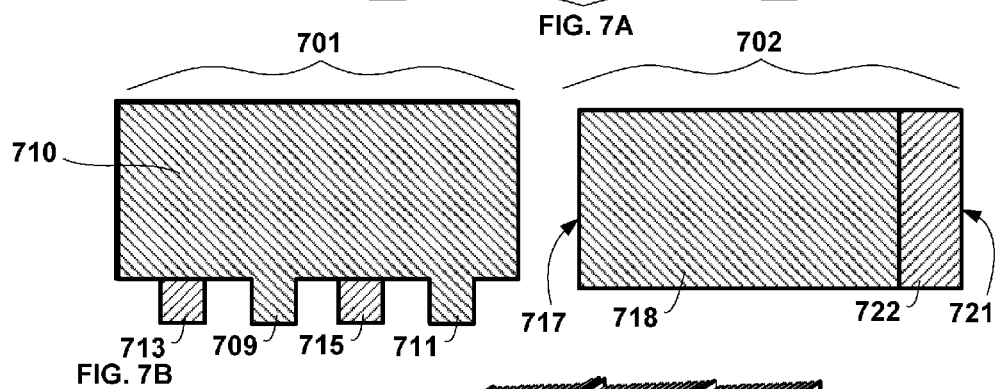

The capacitor first structure 701 includes a first electrode 710 and a first dielectric 712, and a second electrode 714 and a second dielectric 716. The first electrode 710 includes a power first tab 709, a power second tab 711, and a power third edge 719. The second electrode 714 includes a ground first tab 713, a ground second tab 715, and a ground third edge 723. The first electrode 710 and the second electrode 714 are assembled as illustrated in FIG. 7B, and are depicted without the respective dielectrics, such that the first electrode 710 is illustrated with the power first tab 709 and the power second tab 711 on top, and the second electrode 714 (FIG. 7A) is illustrated with only the ground first tab 713 and the ground second tab 715 showing from beneath.

In FIG. 7A, a capacitor second structure 702 exhibits a second characteristic inductance during charging and discharging. In an embodiment, the second characteristic inductance can be characterized as being "not right-hand" in quality, and having a given quantity, L'. Accordingly, the first characteristic inductance during charging and discharging is different from the second characteristic inductance during charging and discharging. In this context, "different" means not opposite. In other words, different means contrary but not opposite.

The capacitor second structure 702 includes a first electrode 718 and a first dielectric 720, and a second electrode 722 and a second dielectric 724. The first electrode 718 includes a power-edge exposure 717. The second electrode 722 includes a ground-edge exposure 721. The first electrode 718 and the second electrode 722 are assembled as illustrated in FIG. 7B, and are depicted without the respective dielectrics, such that the first electrode 718 is illustrated with the power-edge exposure 717 on the left of the FIG., and the second electrode 722 is illustrated with the ground-edge exposure 721 from beneath and on the right of the FIG. In an embodiment, the capacitor first structure 701 and the capacitor second structure 702 are repeated such that a plurality of alternating power and ground plates for each capacitor structure is provided, according to any of the embodiments set forth in this disclosure. In an embodiment, spacing between a given power capacitor electrode and a given ground capacitor electrode is in a range from about 0.1 mil to about 0.5 mils. In an embodiment, the spacing is about 0.3 mils.

Figure 7C:
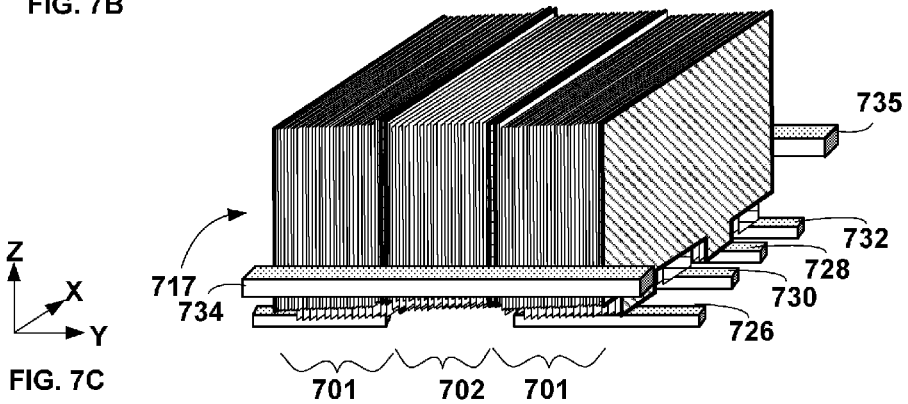

FIG. 7C is a perspective view of portions of the capacitor according to an embodiment. In FIG. 7C, the capacitor first structure 701 is a composite of alternating power and ground electrodes, and the capacitor second structure 702 is a composite of alternating ground and power electrodes.

The capacitor first structure 701 is coupled to a power first terminal 726, a power second terminal 728, a ground first terminal 730, and a ground second terminal 732. The capacitor second structure 702 is coupled to power and ground terminals, one of which is depicted at 734 as a ground sixth terminal 734. The ground sixth terminal 734 contacts the ground electrodes, e.g., second electrode 722 at the ground-edge exposure 721. Similarly, a ground seventh terminal 735 is disposed opposite the ground sixth terminal 734. A power fifth terminal is obscured from view, but contacts the power electrodes, e.g., first electrode 718 at the power-edge exposure 717.

As illustrated in FIG. 7, all terminals are located in substantially a single plane, such that a surface mount of the capacitor is possible. Accordingly, inductive looping in the capacitor is unique to the capacitor embodiment.

FIG. 8 reveals views of a capacitor according to an embodiment.

Figure 8A:
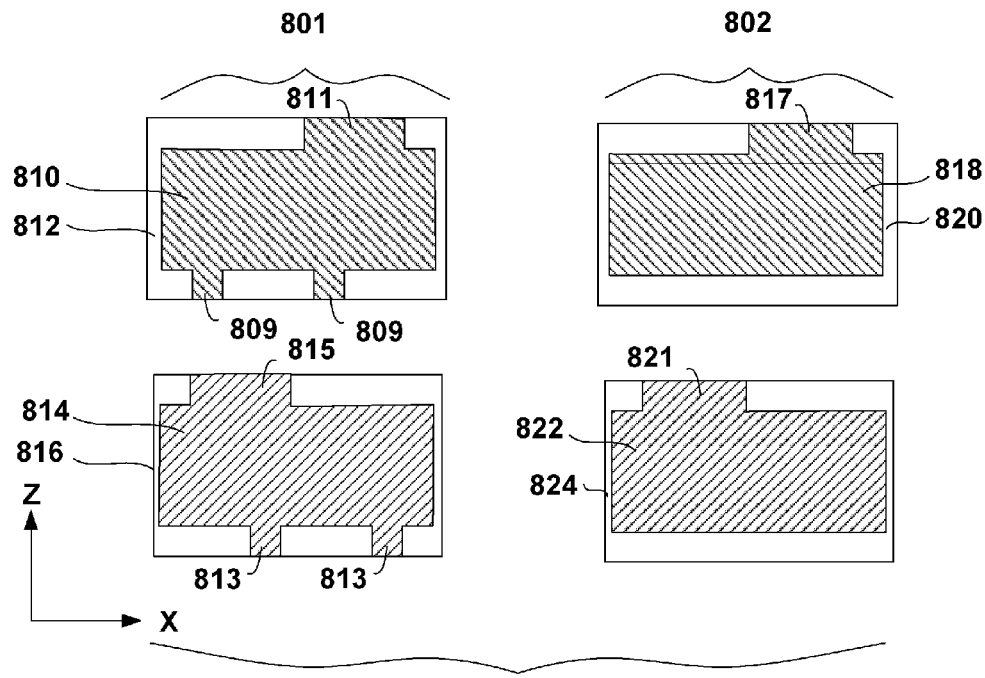
FIGS. 8A and 8B reveal views of a capacitor according to an embodiment.

In FIG. 8A, a capacitor first structure 801 exhibits a first characteristic inductance during charging and discharging. In an embodiment, the first characteristic inductance can be characterized as being "right-hand" in quality, and having a given quantity, L.

Figure 8B:
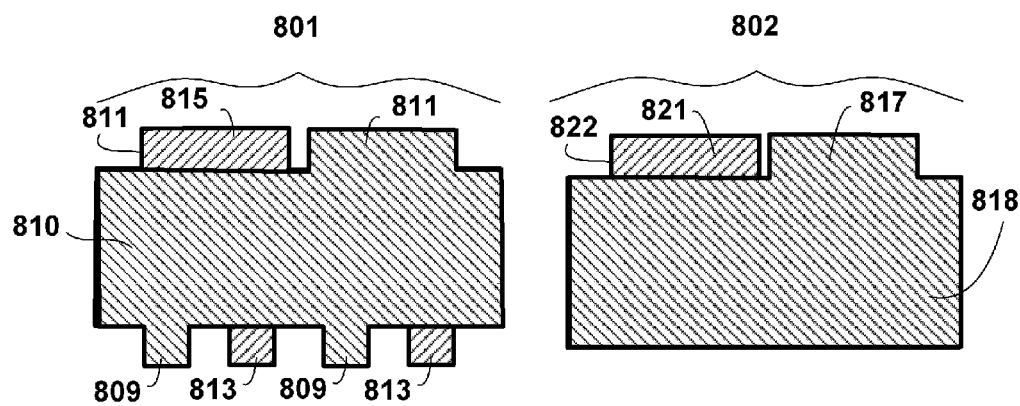

The capacitor first structure 801 includes a first electrode 810 and a first dielectric 812, and a second electrode 814 and a second dielectric 816. The first electrode 810 includes a power first tab 809, two occurrences, and a power-edge exposure 811. The second electrode 814 includes a ground first tab 813, two occurrences, and a ground-edge exposure 815. The first electrode 810 and the second electrode 814 are assembled as illustrated in FIG. 8B, and are depicted without the respective dielectrics, such that the first electrode 810 is illustrated with the power first tabs 809 and the power-edge exposure 811 on top, and the second electrode 814 is illustrated with the ground first tabs 813 and the ground-edge exposure 815 showing from beneath.

In FIG. 8A, a capacitor second structure 802 exhibits a second characteristic inductance during charging and discharging. In an embodiment, the second characteristic inductance can be characterized as being "not right-hand" in quality, and having a given quantity, L'. Accordingly, the first characteristic inductance during charging and discharging is different from the second characteristic inductance during charging and discharging.

The capacitor second structure 802 includes a first electrode 818 and a first dielectric 820, and a second electrode 822 and a second dielectric 824. The first electrode 818 includes a power-edge exposure 817. The second electrode 822 includes a ground-edge exposure 821. The first electrode 818 and the second electrode 822 are assembled as illustrated in FIG. 8B, and are depicted without the respective dielectrics, such that the first electrode 818 is illustrated with the power-edge exposure 817 on the top-right thereof, and the second electrode 822 is illustrated with ground-edge exposure 821 on the top-left thereof.

In an embodiment, the capacitor first structure 801 and the capacitor second structure 802 are repeated such that a plurality of alternating power and ground plates for each capacitor structure is provided, according to any of the embodiments set forth in this disclosure. In an embodiment, spacing between a given power capacitor electrode and a given ground capacitor electrode is in a range from about 0.1 mil to about 0.5 mils. In an embodiment, the spacing is about 0.3 mils.

FIG. 9 reveals views of a capacitor according to an embodiment.

Figure 9A:
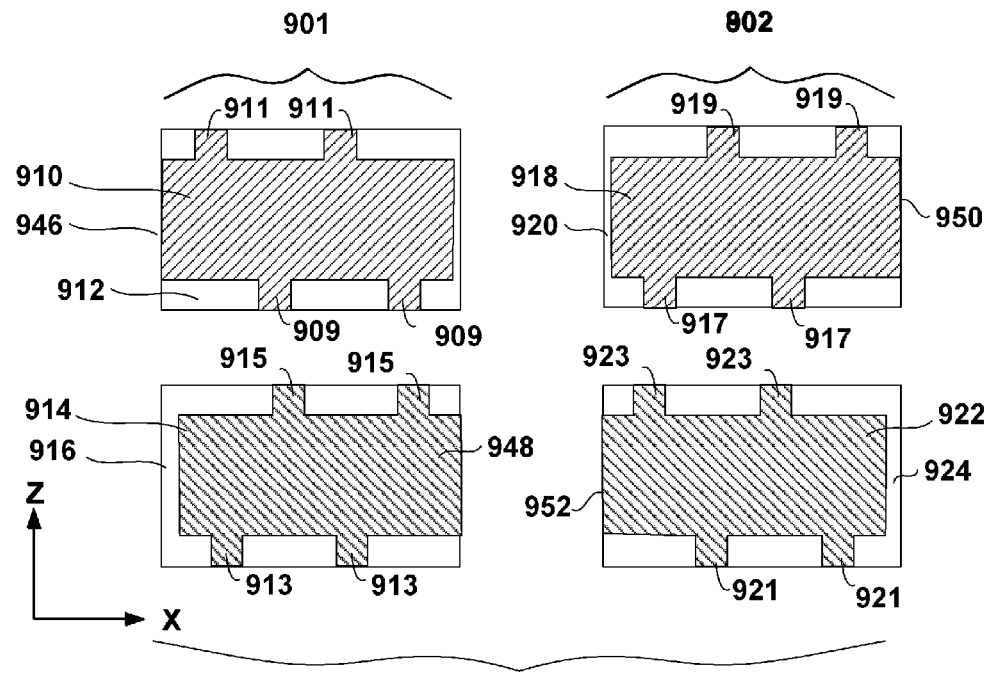
FIGS. 9A and 9B reveal views of a capacitor according to an embodiment.

In FIG. 9A, a capacitor first structure 901 exhibits a first characteristic inductance during charging and discharging. In an embodiment, the first characteristic inductance can be characterized as being "right-hand" in quality, and having a given quantity, L.

Figure 9B:
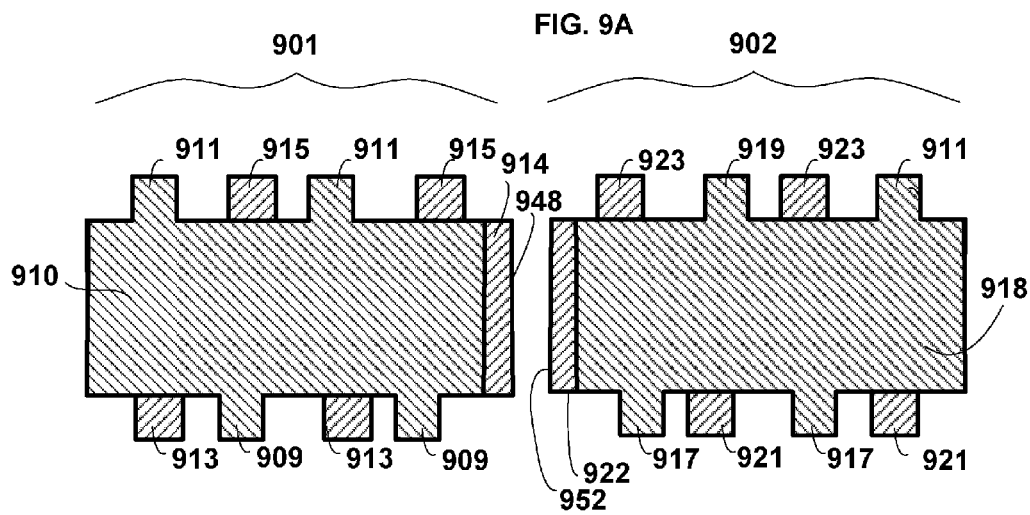

The capacitor first structure 901 includes a first electrode 910 and a first dielectric 912, a second electrode 914 and a second dielectric 916. The first electrode 910 includes a power first tab 909, two occurrences, a power second tab 911, also two occurrences, and a power-edge exposure 946. The second electrode 914 includes a ground first tab 913, two occurrences, a ground second tab 915 also two occurrences, and a ground-edge exposure 948. The first electrode 910 and the second electrode 914 are assembled as illustrated in FIG. 9B, and are depicted without the respective dielectrics, such that the first electrode 910 is illustrated with the power first tabs 909, the power second tabs 911, and the power-edge exposure 946 on top, and the second electrode 914 is illustrated with the ground first tabs 913, the ground second tabs 915, and the ground-edge exposure 948 showing from beneath.

In FIG. 9A, a capacitor second structure 902 exhibits a second characteristic inductance during charging and discharging. In an embodiment, the second characteristic inductance can be characterized as being "left-hand" in quality, and having a given quantity, L. Accordingly, the first characteristic inductance during charging and discharging is substantially opposite the second characteristic inductance during charging and discharging. The effect acts to substantially cancel the individual inductances because of the final structure of the capacitor article.

The capacitor second structure 902 includes a first electrode 918 and a first dielectric 920, and a second electrode 922 and a second dielectric 924. The first electrode 918 includes a power first tab 917, two occurrences, a power second tab 919, also two occurrences, and a power-edge exposure 950. The second electrode 922 includes a ground first tab 921, two occurrences, a ground second tab 923, also two occurrences, and a ground-edge exposure 952. The first electrode 918 and the second electrode 922 are assembled as illustrated in FIG. 9B, and are depicted without the respective dielectrics, such that the first electrode 918 is illustrated with the power first tabs 917, the power second tabs 919, and the power-edge exposure 950 on top, and the second electrode 922 is illustrated with the ground first tabs 921, the ground second tabs 923, and the ground-edge exposure 952 showing from beneath.

In an embodiment, the capacitor first structure 901 and the capacitor second structure 902 are repeated such that a plurality of alternating power and ground plates for each capacitor structure is provided, according to any of the embodiments set forth in this disclosure In an embodiment, a low-inductance capacitor includes the capacitor first structure 901 on one side, the capacitor second structure 902 on the other side, and a capacitor third structure such as the multiple layers of the capacitor second structure 702 sandwiched therebetween as the spacer. In an embodiment, spacing between a given power capacitor electrode and a given ground capacitor electrode is in a range from about 0.1 mil to about 0.5 mils. In an embodiment, the spacing is about 0.3 mils.

Figure 10:
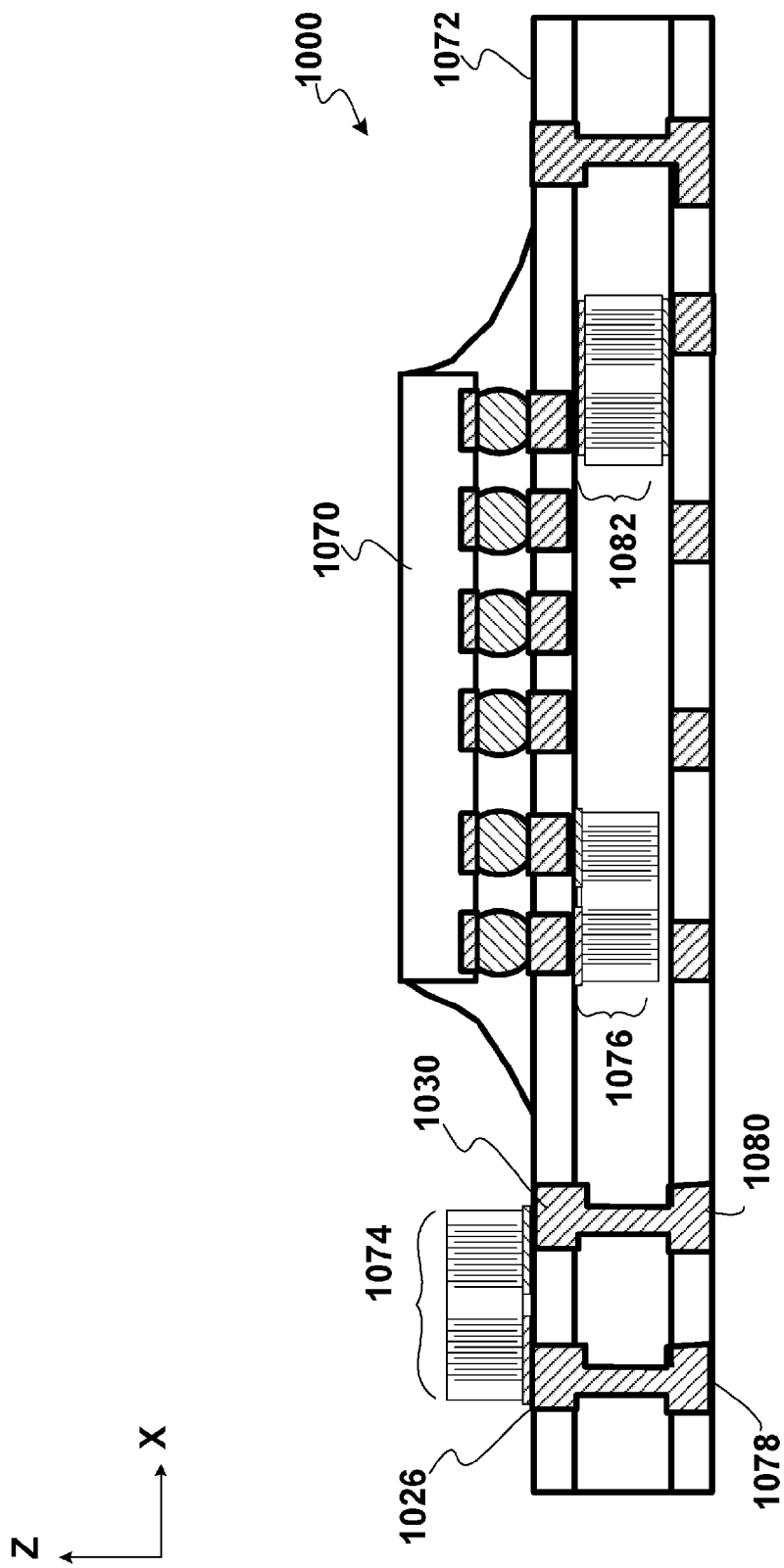
FIG. 10 is a cross-sectional elevation of a package that includes a low-inductance capacitor according to an embodiment.

FIG. 10 is a cross-sectional elevation of a package 1000 that includes a low-inductance capacitor according to an embodiment. The package 1000 includes a die 1070 and a mounting substrate 1072. Two occurrences of a low-inductance capacitor 1074, and 1076 are depicted. In an embodiment, the low-inductance capacitor 1074 is disposed laterally to the die 1070 and upon the mounting substrate 1072. In an embodiment, the low-inductance capacitor 1076 is disposed below the die 1070 and integral to the mounting substrate 1072. In an embodiment, the die 1070 is not present, but a die site occupies the same space on the mounting substrate 1072 that a die such as die 1070 can eventually occupy, and the low-inductance capacitor 1076 is disposed below the die site and is integral to the mounting substrate 1072. In an embodiment, the die 1070 is not present, but a die site occupies the same space on the mounting substrate 1072 that a die such as die 1070 can eventually occupy, and the low-inductance capacitor 1074 is disposed adjacent the die site on the mounting substrate 1072.

The low-inductance capacitor 1074 that is disposed laterally to the die 1070 is illustrated in greater detail. Further to the structure of the low-inductance capacitor 1074 are a first pin-out contact 1078 that contacts, for example, a power terminal 1026 of the low-inductance capacitor 1074, and a second pin-out contact 1080 that consequently contacts a ground terminal 1030.

In an embodiment, the package 1000 includes a low-inductance capacitor 1082 that receives one of its power from above, i.e. through the die 1070, and is coupled to the other of its power or ground from below, i.e. from the mounting substrate 1072.

Figure 11:
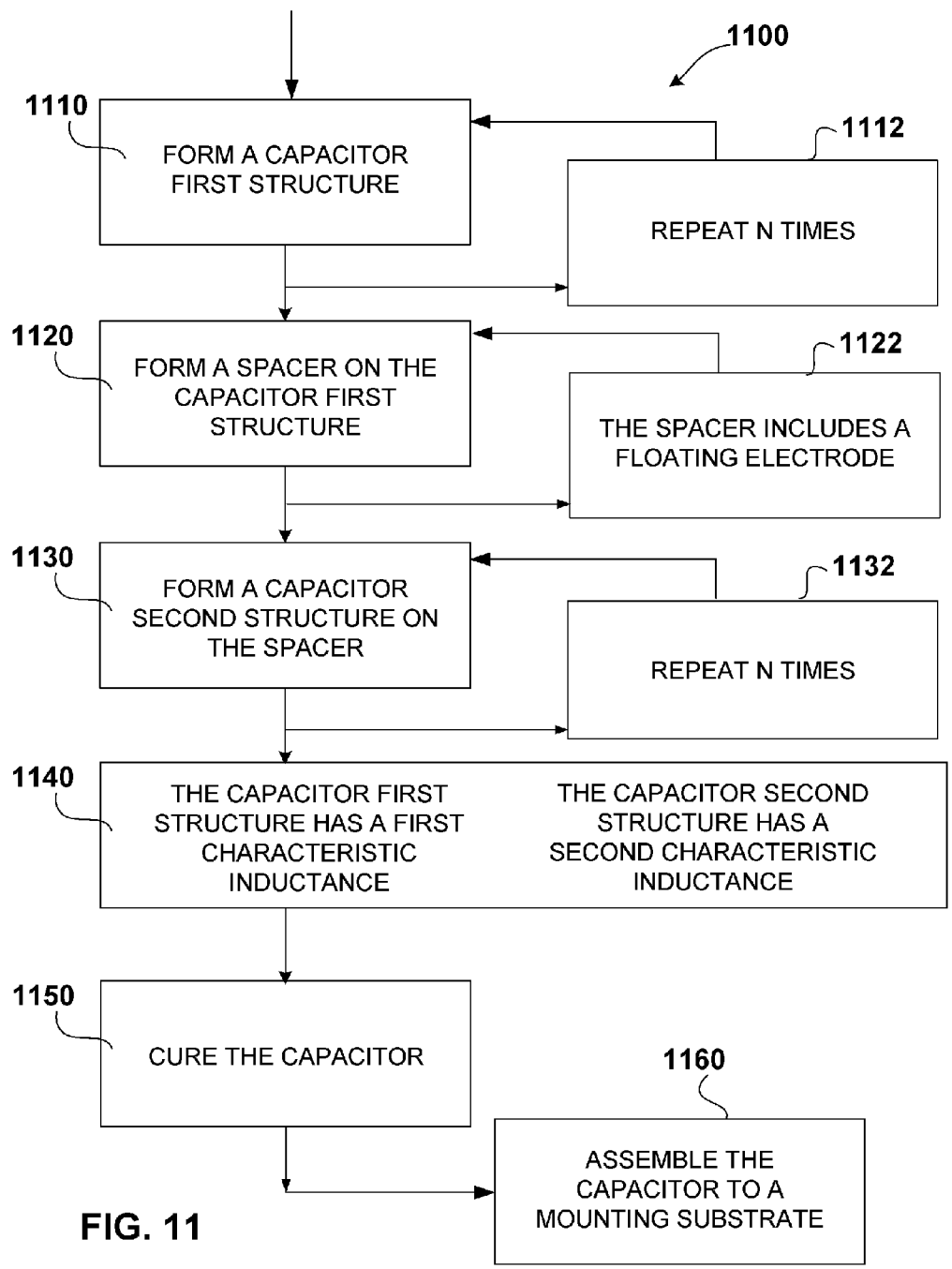
FIG. 11 is a process depiction of forming a low-inductance capacitor according to an embodiment.

FIG. 11 is a process depiction 1100 of forming a low-inductance capacitor according to an embodiment.

At 1110, the process includes forming a capacitor first structure. In a non-limiting example, the process includes forming a first electrode 110 and a first dielectric 112, and a second electrode 114 and a second dielectric 116 as depicted in FIG. 1.

At 1112, the process includes repeating forming a first electrode and a first dielectric, and a second electrode and a second dielectric, N times until a selected number of electrodes are assembled as a capacitor first structure.

At 1120, the process includes forming a spacer on the capacitor first structure. In a non-limiting example, the process includes forming a spacer 103 as depicted in FIG. 1.

At 1122 in a non-limiting example, the process includes forming a spacer 503 with at least one floating electrode 542 as depicted in FIG. 5.

At 1130, the process includes forming a capacitor second structure. In a non-limiting example, the process includes forming a first electrode 118 and a first dielectric 120, and a second electrode 122 and a second dielectric 124 as depicted in FIG. 1.

At 1132, the process includes repeating forming a first electrode and a first dielectric, and a second electrode and a second dielectric, N times until the selected number of electrodes are assembled as the capacitor second structure.

At 1140, an observation can be made by using the capacitor during charging and discharging, that the capacitor first structure has a first characteristic inductance and the capacitor second structure has a second characteristic inductance that is not the same as the first characteristic inductance. As set forth in this disclosure, the first characteristic inductance and the second characteristic inductance can cancel each other. As set forth in this disclosure, the first characteristic inductance and the second characteristic inductance can be dissimilar in quality or quantity.

At 1150 the process includes curing the capacitor. Curing can be done at temperatures above ambient, up to just below the solidus temperature of the electrodes. Curing is done, in an embodiment, in a reducing atmosphere such that oxidation of the electrodes is avoided. Curing is done, in an embodiment, in a non-reactive atmosphere such that reaction of the electrodes is avoided.

At 1160, a method includes assembling the finished capacitor to a mounting substrate. In a non-limiting example, the mounting substrate is a board. In a non-limiting example, the mounting substrate is a microelectronic device principally made from semiconductive material.

Figure 12:
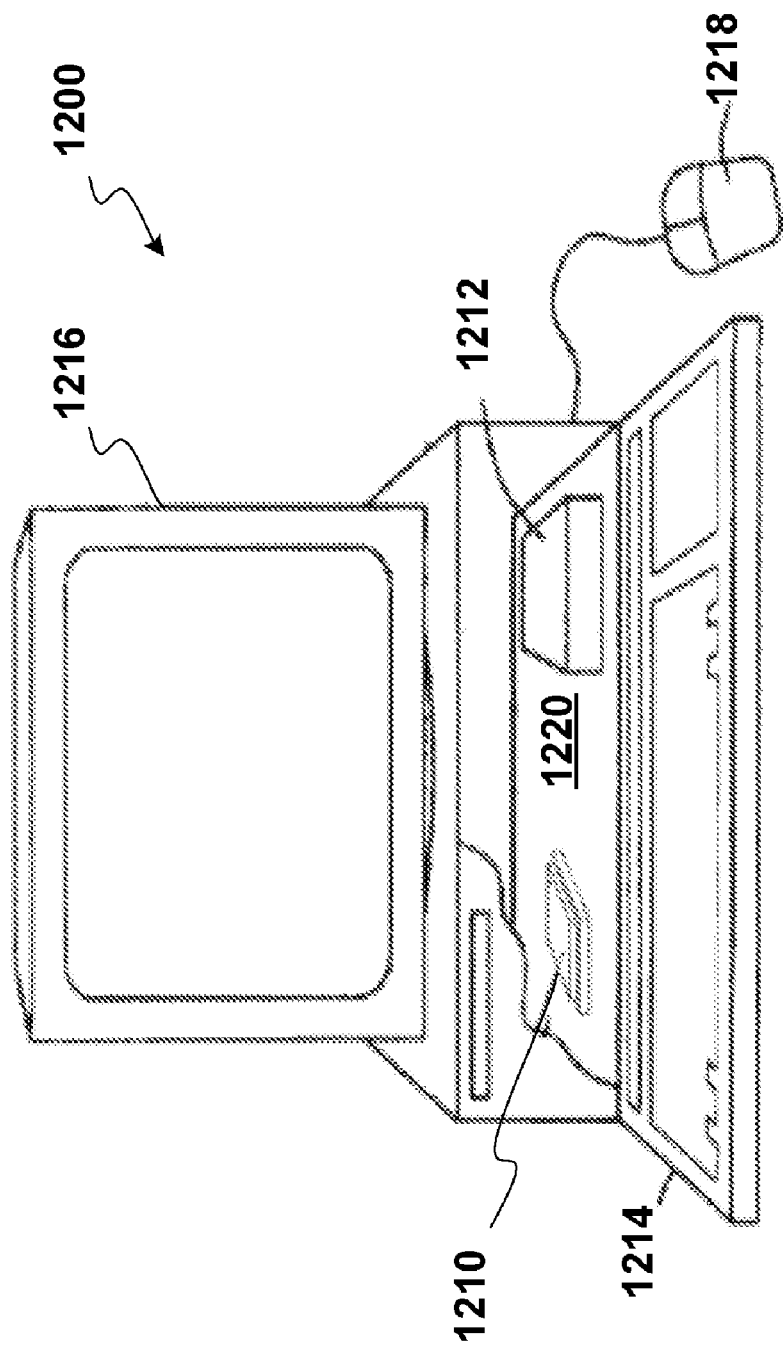
FIG. 12 is a cut-away perspective that depicts a computing system according to an embodiment.

FIG. 12 is a cut-away perspective that depicts a computing system according to an embodiment. One or more of the foregoing embodiments of the low-inductance capacitor may be utilized in a computing system, such as a computing system 1200 of FIG. 12. Hereinafter, any low-inductance capacitor embodiments alone or in combination with any other embodiment is referred to as an embodiment(s) configuration.

The computing system 1200 includes at least one processor (not pictured) which is enclosed in a package 1210, a data storage system 1212, at least one input device such as a keyboard 1214, and at least one output device such as a monitor 1216, for example. The computing system 1200 includes a processor that processes data signals, and may include, for example, a microprocessor, available from Intel Corporation. In addition to the keyboard 1214, the computing system 1200 can include another user input device such as a mouse 1218, for example.

For purposes of this disclosure, a computing system 1200 embodying components in accordance with the claimed subject matter may include any system that utilizes a microelectronic device system, which may include, for example, at least one low-inductance capacitor embodiment that is coupled to data storage such as dynamic random access memory (DRAM), polymer memory, flash memory, and phase-change memory. In this embodiment, the embodiment(s) is coupled to any combination of these functionalities by being coupled to a processor. In an embodiment, however, an embodiment(s) configuration set forth in this disclosure is coupled to any of these functionalities. For an example embodiment, data storage includes an embedded DRAM cache on a die. Additionally in an embodiment, the embodiment(s) configuration that is coupled to the processor (not pictured) is part of the system with an embodiment(s) configuration that is coupled to the data storage of the DRAM cache. Additionally in an embodiment, an embodiment(s) configuration is coupled to the data storage system 1212.

In an embodiment, the computing system 1200 can also include a die that contains a digital signal processor (DSP), a micro controller, an application specific integrated circuit (ASIC), or a microprocessor. In this embodiment, the embodiment(s) configuration is coupled to any combination of these functionalities by being coupled to a processor. For an example embodiment, a DSP (not pictured) is part of a chipset that may include a stand-alone processor and the DSP as separate parts of the chipset on the board 1220. In this embodiment, an embodiment(s) configuration is coupled to the DSP, and a separate embodiment(s) configuration may be present that is coupled to the processor in the package 1210. Additionally in an embodiment, an embodiment(s) configuration is coupled to a DSP that is mounted on the same board 1220 as the package 1210. It can now be appreciated that the embodiment(s) configuration can be combined as set forth with respect to the computing system 1200, in combination with an embodiment(s) configuration as set forth by the various embodiments of the low-inductance capacitor within this disclosure and their equivalents.

Figure 13:
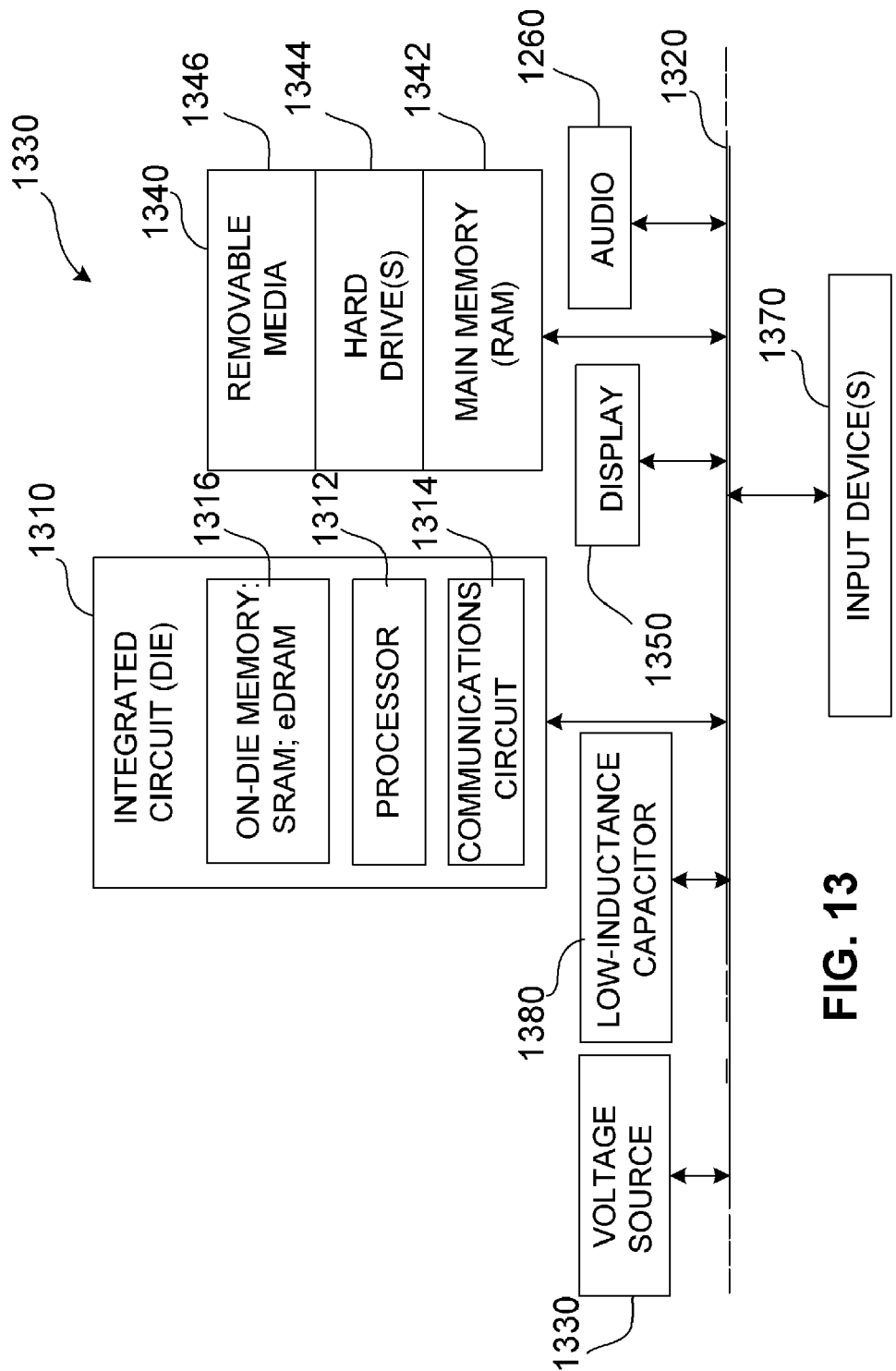
FIG. 13 is a schematic of a computing system according to an embodiment.

FIG. 13 is a schematic of a computing system according to an embodiment. The electronic system 1300 as depicted can embody the computing system 1200 depicted in FIG. 12, but the electronic system is depicted schematically. The electronic system 1300 incorporates at least one electronic assembly 1310, such as an IC package illustrated in FIG. 10. In an embodiment, the electronic system 1300 is a computer system that includes a system bus 1320 to electrically couple the various components of the electronic system 1300. The system bus 1320 is a single bus or any combination of busses according to various embodiments. The electronic system 1300 includes a voltage source 1330 that provides power to the integrated circuit 1310. In some embodiments, the voltage source 1330 supplies current to the integrated circuit 1310 through the system bus 1320.

In an embodiment, a low-inductance capacitor 1380 is electrically located between the voltage source 1330 and the integrated circuit 1310. Such location in an embodiment is in a mounting substrate and the low-inductance capacitor 1380 is integral to the mounting substrate. Such location of the low-inductance capacitor 1380 in an embodiment is upon a mounting substrate that provides a seat for the integrated circuit 1310 and the low-inductance capacitor 1380, such as a processor and a low-inductance capacitor component, each mounted laterally and adjacent to the other on a board.

The integrated circuit 1310 is electrically coupled to the system bus 1320 and includes any circuit, or combination of circuits according to an embodiment. In an embodiment, the integrated circuit 1310 includes a processor 1312 that can be of any type. As used herein, the "processor" 1312 means any type of circuit such as, but not limited to, a microprocessor, a microcontroller, a graphics processor, a digital signal processor, or another processor. Other types of circuits that can be included in the integrated circuit 1310 are a custom circuit or an ASIC, such as a communications circuit 1314 for use in wireless devices such as cellular telephones, pagers, portable computers, two-way radios, and similar electronic systems. In an embodiment, the processor 1310 includes on-die memory 1316 such as static random-access memory (SRAM). In an embodiment, the processor 1310 includes on-die memory 1316 such as embedded dynamic RAM (eDRAM).

In an embodiment, the electronic system 1300 also includes an external memory 1340 that in turn may include one or more memory elements suitable to the particular application, such as a main memory 1342 in the form of RAM, one or more hard drives 1344, and/or one or more drives that handle removable media 1346 such as diskettes, compact disks (CDs), digital video disks (DVDs), flash memory keys, and other removable media known in the art.

In an embodiment, the electronic system 1300 also includes a display device 1350, and an audio output 1360. In an embodiment, the electronic system 1300 includes an input device 1370, such as a keyboard, mouse, trackball, game controller, microphone, voice-recognition device, or any other device that inputs information into the electronic system 1300.

As shown herein, integrated circuit 1310 can be implemented in a number of different embodiments, including an electronic package, an electronic system, a computer system, one or more methods of fabricating an integrated circuit, and one or more methods of fabricating an electronic assembly that includes the integrated circuit and the low-inductance capacitor embodiments as set forth herein in the various embodiments and their art-recognized equivalents. The elements, materials, geometries, dimensions, and sequence of operations can all be varied to suit particular packaging requirements.

It can now be appreciated that low-inductance capacitor embodiments set forth in this disclosure can be applied to devices and apparatuses other than a traditional computer. For example, a die can be packaged with an embodiment(s) configuration, and placed in a portable device such as a wireless communicator or a hand-held device such as a personal data assistant and the like. Another example is a die that can be packaged with an embodiment(s) configuration and placed in a vehicle such as an automobile, a locomotive, a watercraft, an aircraft, or a spacecraft.

The Abstract is provided to comply with 37 C.F.R. §1.72(b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A capacitor comprising:
   a capacitor first structure that exhibits a first characteristic inductance during charging and discharging;
   a capacitor second structure that exhibits a second characteristic inductance during charging and discharging, wherein the first characteristic inductance during charging and discharging is different in quality from the second characteristic inductance during charging and discharging; and
   a spacer disposed against and between the capacitor first structure and the capacitor second structure, wherein the spacer includes at least one floating electrode disposed therein.

2. The capacitor of claim 1, wherein the capacitor first structure includes at least one power electrode and one ground electrode, wherein the capacitor second structure includes at least one power electrode and one ground electrode, and wherein the first characteristic inductance is opposite in quality from the second characteristic inductance.

3. The capacitor of claim 1, wherein the capacitor first structure includes at least one power electrode and one ground electrode, wherein the capacitor second structure includes at least one power electrode and one ground electrode, further including at least one power tab extending on the at least one power electrode.

4. The capacitor of claim 1, wherein the capacitor first structure includes at least one power electrode and one ground electrode, wherein the capacitor second structure includes at least one power electrode and one ground electrode, further including at least one ground tab extending on the at least one ground electrode.

5. The capacitor of claim 1, wherein the capacitor first structure includes at least one power electrode and one ground electrode, wherein the capacitor second structure includes at least one power electrode and one ground electrode, further including at least one power-edge exposure extending on the at least one power electrode.

6. The capacitor of claim 1, wherein the capacitor first structure includes at least one power electrode and one ground electrode, wherein the capacitor second structure includes at least one power electrode and one ground electrode, further including at least one ground-edge exposure extending on the at least one ground electrode.

7. The capacitor of claim 1, wherein the capacitor first structure includes at least one power electrode and one ground electrode, wherein the capacitor second structure includes at least one power electrode and one ground electrode, further including:
- at least one power terminal coupled to the at least one power electrode;
- at least one ground terminal coupled to the at least one ground electrode, and wherein the at least one power terminal and at least one ground terminal are disposed in a coplanar configuration.

8. A capacitor comprising:
- a capacitor first structure that exhibits a first characteristic inductance during charging and discharging;
- a capacitor second structure that exhibits a second characteristic inductance during charging and discharging, wherein the first characteristic inductance during charging and discharging is different in quality from the second characteristic inductance during charging and discharging;
- a spacer disposed against and between the capacitor first structure and the capacitor second structure, wherein the spacer includes at least one floating electrode disposed therein;
- at least one power tab extending on the at least one power electrode; and
- at least one ground tab extending on the at least one ground electrode.

9. The capacitor of claim 8, wherein the capacitor first structure includes at least one power electrode and one ground electrode, wherein the capacitor second structure includes at least one power electrode and one ground electrode, and wherein the first characteristic inductance is opposite in quality from the second characteristic inductance.

* * * * *